United States Patent [19]

Sliwa, Jr. et al.

[11] Patent Number: 5,239,736
[45] Date of Patent: Aug. 31, 1993

[54] METHOD FOR MAKING PIEZOELECTRIC COMPOSITES

[75] Inventors: John W. Sliwa, Jr., Palo Alto; Sevig Ayter, Cupertino; John P. Mohr, III, Los Altos Hills, all of Calif.

[73] Assignee: Acuson Corporation, Mountain View, Calif.

[21] Appl. No.: 790,815

[22] Filed: Nov. 12, 1991

[51] Int. Cl.⁵ .............. H04R 17/00; B23P 17/00
[52] U.S. Cl. .................... 29/25.35; 29/412; 29/418
[58] Field of Search ............ 29/25.32, 412, 416, 29/418; 310/334

[56] References Cited

U.S. PATENT DOCUMENTS 2,266,333  12/1941  Ream ............................ 29/25.35
3,083,444  4/1963   Mitchell et al. .............. 29/418
4,477,783  10/1984  Glenn ............................ 310/334
4,564,980  1/1986   Diepers ......................... 310/334

FOREIGN PATENT DOCUMENTS 68981   3/1989  Japan ............................ 29/25.35
843827  8/1960  United Kingdom ........... 29/25.35

Primary Examiner—P. W. Echols

[57] ABSTRACT

A method is described for making a piezoelectric composite for building an acoustic transducer from two or more pieces of piezoelectric material. Each piece of material is cut to form slots or trenches having a uniform pitch spacing and material portions of uniform width such that the material portions of one piece may be received within the slots or trenches of the other. The pieces are then interdigitated and joined to make the piezoelectric composite.

18 Claims, 1 Drawing Sheet

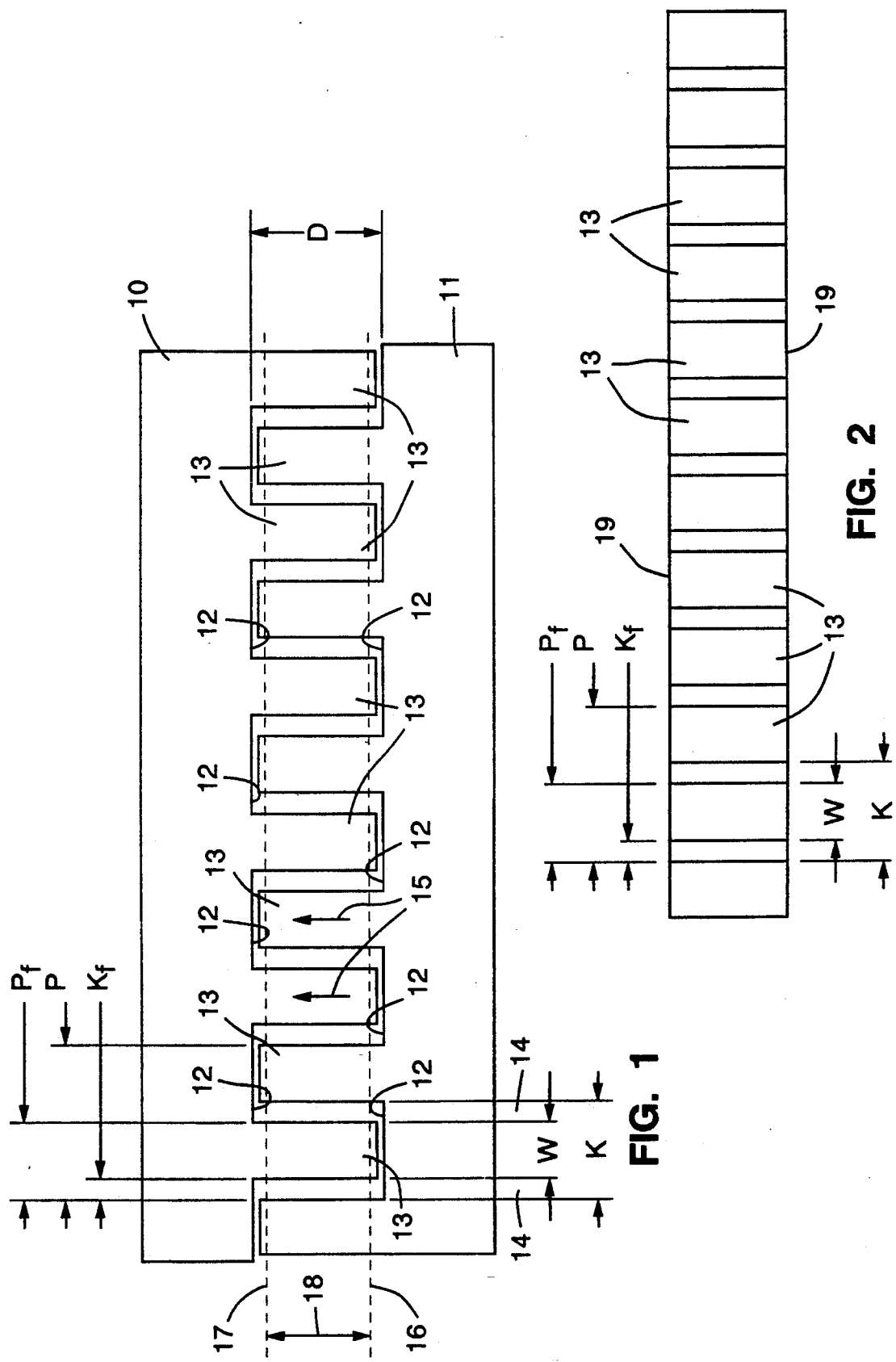

METHOD FOR MAKING PIEZOELECTRIC COMPOSITES

BACKGROUND OF THE INVENTION

This invention relates to the manufacture of ultrasound transducers and more particularly to the fabrication of piezoelectric transducer components of very fine pitch. Ultrasound devices, such as those employed in the medical ultrasound imaging market, typically employ piezoelectric ceramic materials such as lead-zirconate-titanate (PZT) to both emit and receive ultrasound waves. For reasons of formability and improved electroacoustic performance, it can be beneficial to employ a composite piezoelectric material rather than a monolithic slab of PZT. Composites typically consist of individual small pieces of PZT distributed within and isolated by a supporting epoxy or other polymeric plastic matrix material. The pieces of PZT usually consist of small strips or posts embedded in the passive pliable and acoustically lossy host matrix material.

In the case of embedded strips of piezoelectric material, the composite is referred to as "one-dimensional" and each embedded strip can be as much as a few acoustic wavelengths wide. However, the array transducers used in medical ultrasound applications require piezoelectric strips, posts or rods of aspect ratio (width to height) lower than 0.7. The piezoelements of such medical transducers oftentimes must be no wider than this to achieve acceptable sector, linear or vector type phased array transducer performance. Frequently one has to resort to the technique of subdicing the elements such that each element subpiece or subelement is no wider than the above requirement for the aspect ratio. One way to make such a device is to first "subdice" all the subelements on a fine pitch and then electrically gang two, three or even four or more of said subelements to form the macroscopic transducer elements which are on a coarser pitch. A two-dimensional piezoelectric device is formed by dicing or cutting a subelement in two orthogonal directions to form posts or rods rather than strips as formed by dicing in one direction only.

A common and convenient method for making a one-dimensional composite is to start with a monolithic slab of piezoelectric material and, using a dicing saw, cut slots, trenches or gaps therein. After cutting, the slots, trenches or gaps may be back-filled with polymeric matrix material such as an epoxy. A two-dimensional composite can be made by also cutting orthogonal slots. In this bidirectional material, one may choose to cut and fill each direction sequentially for ease of manufacture. After filling the slots, the exposed flat surfaces of the composite structure are ground and lapped, as necessary, and then metalized or electroded and repoled, if necessary. The resulting structure essentially comprises a semiflexible mat consisting of strips, posts or rods of piezoelectric material laterally encased by polymeric matrix material such as epoxy. The isolated strips, posts or rods (which are typically made of PZT) have their opposite exposed edges or ends in contact with the metalized or electroded surfaces.

Composite piezoelectric materials have been shaped and formed to achieve the mechanical focussing of ultrasound waves. Composites have also been made for use in special applications to provide improved electroacoustic characteristics compared to those obtainable with monolithic piezomaterial. Examples of such applications include annular arrays and mechanically scanned low-mass devices commonly employed in the medical ultrasound field.

To satisfy the need for higher and higher frequency transducers, it is necessary to find ways to make composites having a very fine pitch between adjacent PZT strips or posts. This is based upon the fact that the thickness must decrease as the operational ultrasonic wavelength decreases and the pitch should also decrease in order to satisfy the above-mentioned aspect ratio criterion.

At the present time, the dicing technology utilizes diamond-abrasive thin-foil blades which rotate at 30,000–60,000 RPM. However, the use of such blades has limitations with respect to cutting increasingly narrow trenches or kerfs at constant or even increasing depths which is necessary to produce finer pitch composites. Blades of 15 microns and less thickness are hard to work with and difficult to obtain. In addition such blades simply become mechanically unstable when used to cut very thin slots at great depths. In addition, as the ratio of cut depth/blade thickness (and kerf width) increases, the blade life is shortened, the kerf taper becomes unacceptable and the frequency of catastrophic blade failure increases. Obviously, if dicing is undertaken at a very fine pitch and the composite is of large macroscopic size, it is likely that a blade failure in the midst of dicing will ruin that part as a whole. A substantial value-added which has been invested to the point of failure is thereby lost to scrap. Thus, the difficulty of achieving narrower kerfs, or slots, limits or prohibits the manufacture of the finer pitch composites with high yield.

SUMMARY OF THE INVENTION

The principal object of this invention is to provide a better method for fabricating and manufacturing "dice and fill" composites for use in ultrasonic transducers, particularly those having a very fine pitch, and an even closer spacing of PZT elements as needed for high frequency devices.

A further object is to provide an improved methodology which allows the manufacture of acoustic devices with PZT elements having different and/or complementary properties, an advantage not possible with monolithic structures.

The key innovation of this invention is to form two mating slabs or pieces of diced piezoelectric ceramic using a conventional dicing blade or laser cutting technique. The two slabs are each diced to provide relatively wide slots or kerfs on a common pitch or spacing. The diced surface of each slab is then wetted with epoxy such that the slots or kerfs fill up partially or fully. The two diced surfaces are then brought together in aligned face-to-face relation such that the strips or posts of one are received within the slots of the other and, thus, interdigitate to form a composite slab having strips or posts with half the pitch dimension and twice the density of the two starting slabs. Depending on the application, the epoxy can completely fill the space between the strips or posts, or it can be applied only to portions of said slabs, resulting in a mostly "air filled" composite. The epoxy is then cured and the interdigitated and cured slabs are ground, lapped down in the conventional manner and prepared for metallization and repoling, if necessary.

The invention disclosed herein allows one to produce composite PZT acoustic devices which have kerf widths which can be reduced to near zero dimension and subelement pitches which are substantially tighter than is possible using the same tools and the aforementioned monolithic approach. The method allows one to employ relatively wide cuts made with laterally stiff and thick blades and yet produce extremely fine-pitched composites.

BRIEF DESCRIPTION OF THE DRAWINGS

In the drawings forming a part of this application and in which like parts are identified by like reference numerals throughout the same, FIG. 1 is a vertical section of a pair of piezoelectric slabs diced and interdigitated in accordance with the preferred embodiment of invention; and FIG. 2 is a similar section of the interdigitated slabs of FIG. 1 depicting the appearance after grinding and lapping processes have been executed on the top and bottom surfaces and said surfaces have been metalized or electroded.

DESCRIPTION OF THE PREFERRED EMBODIMENT

FIG. 1 shows a pair of slabs 10 and 11, each formed of piezoelectric material in accordance with the preferred embodiment of the invention. Each slab is complementary to the other and, as shown, has been diced or cut to form kerfs or slots 12 of a width K and a depth D. Slots 12 define therebetween a plurality of posts or strips 13 of a width W. As shown, posts 13 of one slab interdigitate with the posts of the other slab, leaving gaps 14 between the posts of one slab and the adjacent post of the other slab. This arrangement allows the transducer piezocomposites to be formed with multiple gaps 14 which can be much narrower than is possible utilizing conventional manufacturing techniques.

It may be desirable to implement the posts or strips such that they have slightly tilted sidewalls and are not perfectly rectangular in section. This eases the process of interdigitation in that gaps 14 are not established until the mating slabs are fully interdigitated. Such post or strip tapering also allows for an additional acoustic design degree of freedom. It also may be desirable acoustically to have a thickness taper present in slabs 10 and/or 11 for the purpose of manipulating the acoustic spectrum.

The two slabs 10 and 11 may be electrically prepoled in the direction or sense 15 as is commonly the practice before dicing. However, poling may also take place after dicing so long as the appropriate electrodes are available and accessible.

For purposes of simplifying FIGS. 1 and 2, we have shown slabs 10 and 11 being cut to a depth D—less than the slab thickness. It is an option to mount slabs 10 and 11 on individual carrier plates which in turn allow one to have D larger than the slab thickness. It is also an option to have slabs 10 and/or 11 themselves have additional acoustic layers such as acoustic matching layers laminated to them before such cutting and interdigitation. In that manner, one gets a component acoustically matched to what it ultimately needs to couple into.

The gaps 14 may be filled with a polymeric material, as is customary and standard practice in the manufacture of composite transducers, or they may be left, at least in part, unfilled. The choice of whether to use a gap-filling material is largely a matter of trade-offs. The use of gap-filling material results in better structural integrity but poorer interelement acoustic isolation. The gap-filling material may contain microspheres, as for example polystyrene or other plastic spheres, which are introduced in sufficient concentration and of the appropriate size to force all the gaps to have the same dimension. However, the use of too many microspheres may increase acoustic crosstalk and make interdigitation more difficult. It is contemplated that the size or diameter of the microspheres should be selected to be of the same order of magnitude as the size of the desired gaps 14. If the microspheres have resiliency or give, as is the usual case of polymeric spheres, it is beneficial to purposefully design a slight mechanical interference between the microspheres and adjacent posts to insure that said spheres force the posts to the right uniform spacing.

There are essentially three choices for the method of interdigitation and gap filling. One method is to dry-assemble the slabs 10 and 11 and then introduce the gap filling material. A second method is to prewet the slabs and/or their slots with such filler matrix material and forcibly displace the excess amount as the two slabs are brought together and the strips or posts of one are interdigitated with the strips or posts of the other. A third process for filling the gaps is a variation on the second wherein the slabs are prewetted, interdigitated and then pull themselves together through capillary forces and/or atmospheric forces induced by a controlled withdrawal of excess filler material. The microspheres may, if used, either be present in the epoxy or polymer matrix material when it is used or may alternatively be placed in the kerfs without the epoxy and said epoxy added afterwards.

A fourth possible approach is to not completely fill the gaps or to fill them temporarily, removing some or all of the filler using wet or dry etching processes, dissolution or sublimation in order to achieve air gaps to maximize interelement acoustic isolation.

It is to be understood in FIG. 1 that the portions of the slabs 10 and 11 extending below the phantom line 16 and above the phantom line 17 are ground or lapped away in further processing of the manufacturing cycle. The remaining central or intermediate portions between phantom lines 16 and 17, indicated by the double arrowhead line 18, then constitutes a stand-alone composite mat consisting of isolated posts or strips made of piezoelectric material encased, or laterally surrounded, by a mat of polymeric material. The exposed end-surfaces of the posts are then metalized in order to form the needed electrodes.

The removal of gap filling polymer, if partial airgaps are desired, is most easily and conveniently achieved after removal of the piezoelectric material above and below phantom lines 16 and 17, respectively.

FIG. 2 illustrates the final PZT composite component for use in a transducer after the removal of the excess piezoelectric material on the opposite sides of the interdigitated subassembly of FIG. 1. As shown, the surfaces are metalized or coated with an electrically conductive layer 19. This is done using conventional sputtering, evaporation or other thick film deposition processes.

Although a preferred embodiment of the invention has been illustrated and described, various modifications and changes may be resorted to without departing from the spirit of the invention or the scope of the appended claims, and each of such modifications and changes is contemplated.

What is claimed is:

1. A method for making a piezoelectric composite from two or more pieces of piezoelectric or electrostrictive material comprising the steps of:
   forming two structures each comprised of piezoelectric elements of width W separated by a gap distance K on a pitch spacing P;
   interdigitating the two structures, the elements of one structure being interdigitated with the elements of the other structure;
   joining the interdigitated elements to form a composite suitable for use in an acoustic transducer;
   removing those portions of piezoelectric material of each structure that interconnect the ends of elements;
   then coating the opposite surfaces of the composite to interconnect the elements with an electrically conductive layer.

2. The method of claim 1 wherein the elements of piezoelectric material are joined such that $P>K>W$.

3. The method of claim 1 and further comprising the step of prewetting the elements of each structure with a settable polymer prior to interdigitation, said polymer joining the elements of the two structures upon subsequent interdigitation and solidification.

4. The method of claim 1 wherein the gaps or kerfs between elements of at least one structure is coated or filled with microspheres prior to interdigitation, said microspheres providing a uniformity of spacing between interdigitated elements.

5. A method for making a composite piezoelectric device from two or more pieces of piezoelectric and/or electrostrictive material comprising the steps of:
   cutting each of two pieces of material to form slots, trenches or through-cuts therein, said slots, trenches or cuts separating two or more portions of each piece by a gap distance K, said slots, trenches or cuts being formed on a pitch-spacing P and forming material portions or elements of width W such that the two pieces of material may be interdigitated;
   interdigitating the two pieces of material, the material portion of one piece being received in the slots, trenches or cuts of the second piece and vice versa;
   joining the two interdigitated pieces to form a composite device;
   removing those portions of piezoelectric material of each structure that interconnect the end of elements;
   then coating the opposite surfaces of the composite to interconnect the elements with an electrically conductive layer.

6. The method of claim 5 wherein the elements of piezoelectric material are joined such that $P>K>W$.

7. The method of claim 5 and further comprising the step of prefilling or prewetting the slots of each piece of material to be interdigitated with a settable polymer prior to interdigitation, said polymer joining the two pieces upon interdigitation and subsequent solidification.

8. The method of claim 5 wherein said material is a piezoelectric or electrostrictive material and is cut to form portions of width W less than seven-tenths of the thickness D.

9. The method of claim 5 further utilizing the steps of cutting, interdigitation and joining two pieces of material to produce a final composite having a two-dimensional wave transmission or reception capability utilizing starting materials which consist of two structures formed by the method of claim 5.

10. The method of claim 5 or 9, and vertically stacking and laminating the structures to form a piezoelectric composite having a three-dimensional wave transmission or reception capability.

11. The method of claims 5 or 9 wherein said composite structure is subsequently deformed into a curved surface for purposes of achieving a degree of mechanical focussing of either transmitted or received ultrasonic waves.

12. The method of claim 5 wherein the step of cutting is accomplished utilizing any combination of mechanical abrasive sawing, laser cutting, ultrasonic cutting, electrodischarge machining and wet or dry etching.

13. The method of claim 5 wherein said composite structure is formed with multiple and different thicknesses of piezoelectric starting materials to achieve broadband functionality.

14. The method of claim 5 wherein said two pieces of material are cut to form a plurality of complementary and matching arrays of slots, strips or posts.

15. A method for making a composite piezoelectric device from two or more slabs or piezoelectric material, each slab at least initially having a substantially planar surface, and comprising the steps of:
   forming a plurality of parallel slots, trenches, or through-cuts in the surface of each slab, said slots, trenches or through-cuts being formed on a pitch spacing P and defining therebetween material portions or elements of width W, each slot, trench or through-cut separating adjacent element portions by a gap distance K such that the material portions of the two slabs may be interdigitated;
   interdigitating the two slabs, the portions of one slab being received int he slots, trenches or through-cuts of the second slab and vice versa;
   joining the two slabs to form a composite device;
   removing those portions of piezoelectric material of each structure that interconnect the ends of elements;
   then coating the opposite surfaces of the composite to interconnect the elements with an electrically conductive layer.

16. The method of claim 15 wherein said slabs are cut or diced such that $P>K>W$.

17. A method for making a composite piezoelectric device of two or three dimensions comprising the steps of claim 15 to form a first acoustic transducer having one-dimension, then forming a plurality of second slots perpendicular to the slots already formed in each slab, said second slots separating two or more portions by a gap distance $K_1$, said slots being formed on a pitch spacing $P_1$ and forming material portions of width $W_1$; forming a plurality of parallel slots in the surface of a third slab of piezoelectric material, said slots being formed on a pitch spacing $P_1$ and defining therebetween material portions of width $W_1$, each slot separating adjacent portions by a gap distance $K_1$; interdigitating the third slab with the first acoustic transducer, the portions of the third slab being received in the second slots of the first acoustic transducer and vice versa; and then joining the two structures to form a composite acoustic transducer structure of two-dimension or greater.

18. The method of claim 17 wherein said first acoustic transducer and third slab are cut or diced such that $P_1>K_1>W_1$.

* * * * *